(12) United States Patent
Kim et al.

(10) Patent No.: US 8,830,749 B2
(45) Date of Patent: Sep. 9, 2014

(54) SEMICONDUCTOR MEMORY DEVICE AND METHOD FOR CONTROLLING THE SAME

(71) Applicant: SK hynix Inc., Icheon-si (KR)

(72) Inventors: Jee Yul Kim, Icheon-si (KR); Ji Kyung Jeong, Busan (KR)

(73) Assignee: SK hynix Inc., Icheon (KR)

( * ) Notice: Subject to any disclaimer, the term of this patent is extended or adjusted under 35 U.S.C. 154(b) by 45 days.

(21) Appl. No.: 13/692,986

(22) Filed: Dec. 3, 2012

(65) Prior Publication Data

US 2013/0141975 A1 Jun. 6, 2013

(30) Foreign Application Priority Data

Dec. 2, 2011 (KR) .......................... 10-2011-0128236

(51) Int. Cl.
G11C 16/06 (2006.01)
G11C 29/00 (2006.01)
G11C 16/08 (2006.01)

(52) U.S. Cl.
CPC .............. G11C 16/08 (2013.01); G11C 29/789 (2013.01)
USPC ............. 365/185.09; 365/185.12; 365/189.07

(58) Field of Classification Search
USPC .......... 365/185.09, 185.12, 189.07, 200, 201, 365/185.11
See application file for complete search history.

(56) References Cited

U.S. PATENT DOCUMENTS

| 6,496,413 | B2 * | 12/2002 | Taura et al. ............... 365/185.09 |
| 6,532,181 | B2 * | 3/2003 | Saito et al. .................... 365/200 |
| 7,861,059 | B2 | 12/2010 | Magliocco et al. |
| 8,270,238 | B2 * | 9/2012 | Norman ........................ 365/200 |
| 2010/0046292 | A1 | 2/2010 | Hahn et al. |

FOREIGN PATENT DOCUMENTS

| KR | 1020100024258 A | 3/2010 |
| KR | 20110078739 A | 7/2011 |

* cited by examiner

Primary Examiner — David Lam

(57) ABSTRACT

A semiconductor memory device capable of reducing the size of a NAND flash memory device includes a latch unit configured to store a bad block address, a comparator configured to compare the bad block address with an access address so as to output a bad-block detection signal, and a bad block controller configured to sequentially output a plurality of bad block pulses corresponding to the bad-block detection signal during a predetermined period in response to a plurality of bad-block flag signals that are sequentially activated.

17 Claims, 4 Drawing Sheets

SEMICONDUCTOR MEMORY DEVICE AND METHOD FOR CONTROLLING THE SAME

CROSS-REFERENCE TO RELATED APPLICATION

The priority of Korean patent application No. 10-2011-0128236 filed on Dec. 2, 2011, the disclosure of which is hereby incorporated in its entirety by reference, is claimed.

BACKGROUND OF THE INVENTION

Embodiments of the present invention relate to a semiconductor memory device, and more particularly to a technology for reducing the size of circuitry relating to a bad block of a NAND flash memory device.

Semiconductor memory devices capable of storing data therein are generally classified into Random Access Memory (RAM) devices and Read Only Memory (ROM) devices.

Data stored in the RAM device is lost when power supply is stopped, so that the RAM device is referred to as a volatile memory device. On the other hand, data stored in the ROM device is not lost even when power supply is stopped. Thus, the ROM device is referred to as a non-volatile memory device.

A flash memory device serving as a non-volatile memory device is characterized in that writing and erasing of data are electrically performed. A memory cell array of the flash memory device is composed of a plurality of blocks, and each of the blocks is composed of a plurality of pages. A block is used as a minimum unit for erasing data stored in the memory cell array.

During a program or erase operation, the flash memory device may use not only a tunneling effect based on a high-energy barrier but also a hot carrier effect generated when hot carriers having high kinetic energy pass through an insulation material.

Defective or failed flash memory cells may occur because of a plurality of limitations encountered in a process for fabricating a highly-integrated flash memory device.

In the process for fabricating or operating the flash memory device, a fatal defect frequently occurs in a memory cell of the flash memory device. Assuming that a specific block includes at least one memory cell having a defect, the specific block is generally referred to as a bad block. If the number of bad blocks in the flash memory device is equal to or higher than a predetermined value, the flash memory device is determined to be defective.

On the other hand, if the number of bad blocks in the flash memory device is smaller than the predetermined value, the flash memory device can manage the bad blocks using a variety of methods. A representative method from among the various methods is a bad-block mapping method for replacing each bad block with a redundant block.

According to the bad-block mapping method, an address of each bad block is recognized, and data is prevented from being written in or read from the bad block. The bad block is replaced with a redundant block, and a write or read operation is performed through the redundant block when the address of the bad block is input.

If a NAND flash memory device has one or more bad bits, the NAND flash memory device determines a block having the one or more bad bits to be a bad block, and stores information regarding the bad block, e.g., an address of the bad block. After that, if an operation for accessing the bad block is performed, the bad block is identified by a corresponding address, so that the operation for accessing the bad block is blocked.

A conventional non-volatile memory device includes a comparator circuit per plane to determine whether an input address corresponds to a bad block.

Thus, as the number of planes increases, the chip size also increases. Particularly, as the non-volatile memory device is highly integrated, it becomes more important to reduce the chip size.

BRIEF SUMMARY OF THE INVENTION

Various embodiments of the present invention are directed to providing a semiconductor memory device that substantially obviates one or more problems due to limitations and disadvantages of the related art.

An embodiment of the present invention relates to a technology for identifying a bad block when an address for accessing the bad block is input, using one comparator circuit irrespective of the number of planes in a semiconductor memory device, thereby reducing the chip size of the semiconductor memory device.

In accordance with one embodiment of the present invention, a semiconductor memory device includes a memory cell array including a plurality of planes, each plane including a plurality of blocks; a bad block detector configured to determine whether each of input addresses for accessing corresponding blocks of the plurality of planes corresponds to any of bad block addresses and sequentially output a plurality of bad-block pulses showing the determination results according to an input sequence of the input addresses, a bad block address being an address for accessing a block determined as a bad block; and a block selector configured to receive the plurality of bad-block pulses and select the corresponding blocks of the plurality of planes in response to the plurality of bad-block pulses, respectively.

In accordance with another embodiment of the present invention, a method for controlling a semiconductor memory device, which includes a memory cell array having a plurality of planes, the method comprising: sequentially receiving input addresses for accessing corresponding blocks of the plurality planes, each plane including a plurality of blocks; comparing, by a single comparison unit, each of the input addresses with bad block addresses each of which is an address for accessing a block determined as a bad block; sequentially outputting a plurality of bad-block pulses showing the comparison results according to an input sequence of the input addresses, wherein the plurality of bad-block pulses corresponds to the plurality of planes, respectively; and accessing blocks of the plurality of planes in response to the plurality of bad-block pulses, respectively.

In accordance with another embodiment of the present invention, a semiconductor memory device includes a latch unit configured to store a bad block address; a comparator configured to compare the bad block address with an access address so as to output a bad-block detection signal; and a bad block controller configured to sequentially output a plurality of bad block pulses corresponding to the bad-block detection signal during a predetermined period in which a plurality of bad-block flag signals to be sequentially activated is enabled.

In accordance with another embodiment of the present invention, a semiconductor memory device includes: a memory cell array in which a read or write operation of data is achieved; a bad block detector for comparing an access address with a bad block address, and sequentially outputting a plurality of bad block pulses including bad block information; and a block selector for selecting a block of the memory cell array and disabling a bad block detected from the bad block detector.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
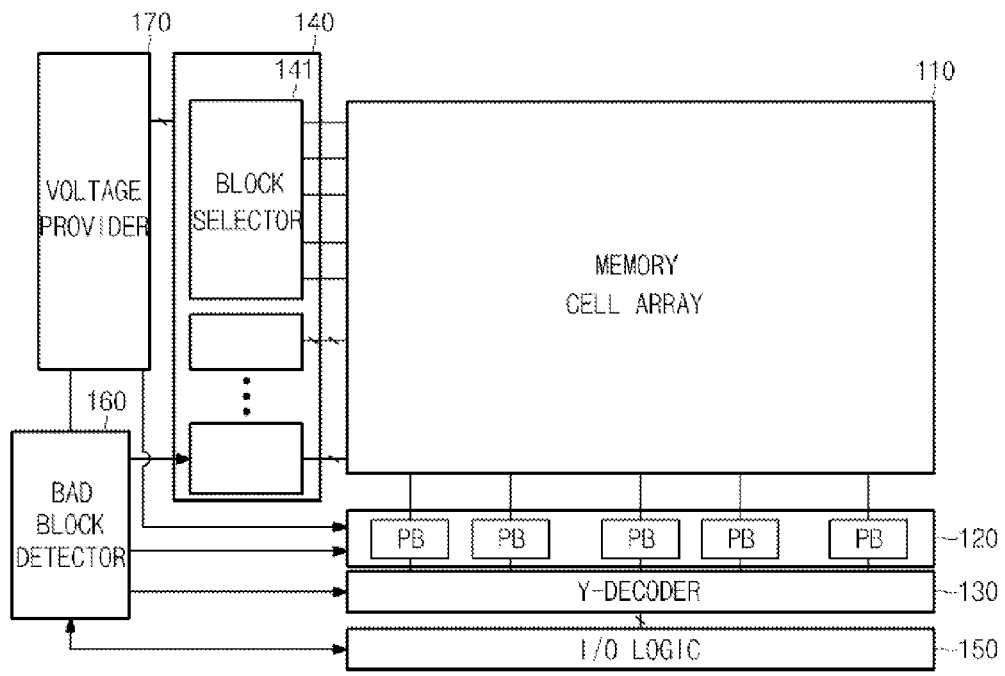
FIG. 1 illustrates a circuit diagram of a semiconductor memory device according to an embodiment of the present invention.

FIG. 1 illustrates a circuit diagram of a semiconductor memory device according to an embodiment of the present invention.

Referring to FIG. 1, the semiconductor memory device includes a memory cell array 110, a page buffer group 120, a row (X) decoder 140, a column (Y) decoder 130, an input/output (I/O) logic 150, a bad block detector 160, and a voltage provider 170.

In an embodiment, the memory cell array 110 includes a plurality of planes, each plane including a plurality of memory blocks. Some of the memory blocks may store option information, address information, etc. Each of the memory blocks includes a plurality of cell strings.

The page buffer group 120 includes a plurality of page buffers (PBs) coupled to bit lines.

The column (Y) decoder 130 provides a data I/O path to the page buffers PBs of the page buffer group 120 in response to a control signal.

The row (X) decoder 140 includes a plurality of block selectors 141 coupled to respective memory blocks. The block selector 141 enables each memory block coupled thereto, in response to an address signal.

If the memory block is enabled by a block selection switch, lines (for example, word lines) in the memory block are coupled to global lines (for example, global word lines), each providing an operation voltage. In an embodiment, the operation voltage applied to the global lines is received from the voltage provider 170.

The voltage provider 170 generates a plurality of operation voltages in response to a control signal, and provides the operation voltages to the global lines. The I/O logic 150 controls data I/O operations between the semiconductor memory device and an external node in response to an I/O control signal.

The bad block detector 160 includes a plurality of logics for outputting control signals that control the page buffer (PB) group 120, the column (Y) decoder 130, the row (X) decoder 140, the I/O logic 150, and the voltage provider 170. The bad block detector 160 compares an input address with a stored bad block address so as to detect if a bad block is to be accessed by the input address.

The block selector 141 of the row (X) decoder 140 can select a target block according to the detection result of the bad block detector 160.

If a memory block coupled to the block selector 141 is detected as a bad block according to the detection result of the bad block detector 160, the block selector 141 prevents the corresponding memory block from being enabled.

There are a variety of methods whereby the block selector 141 does not enable the memory block if it is a bad block.

For example, if a general circuit configuration of the block selector 141 includes a fuse in a block-address input circuit and the fuse is coupled to a bad block, the fuse in the block selector 141 is blown or cut in such a manner that the bad block is not enabled.

In another embodiment, an address of the bad block, i.e., a bad block address, is stored as option information in a specific memory block or a separate storage unit. In other words, some memory blocks are used to store a bad block address, a repair address, option information, etc.

In an embodiment, if the bad block address is stored in a memory block, whether an input block address corresponds to the bad block address may be detected.

For this purpose, according to an embodiment, the bad block detector 160 includes a comparator and a latch unit.

Figure 2:
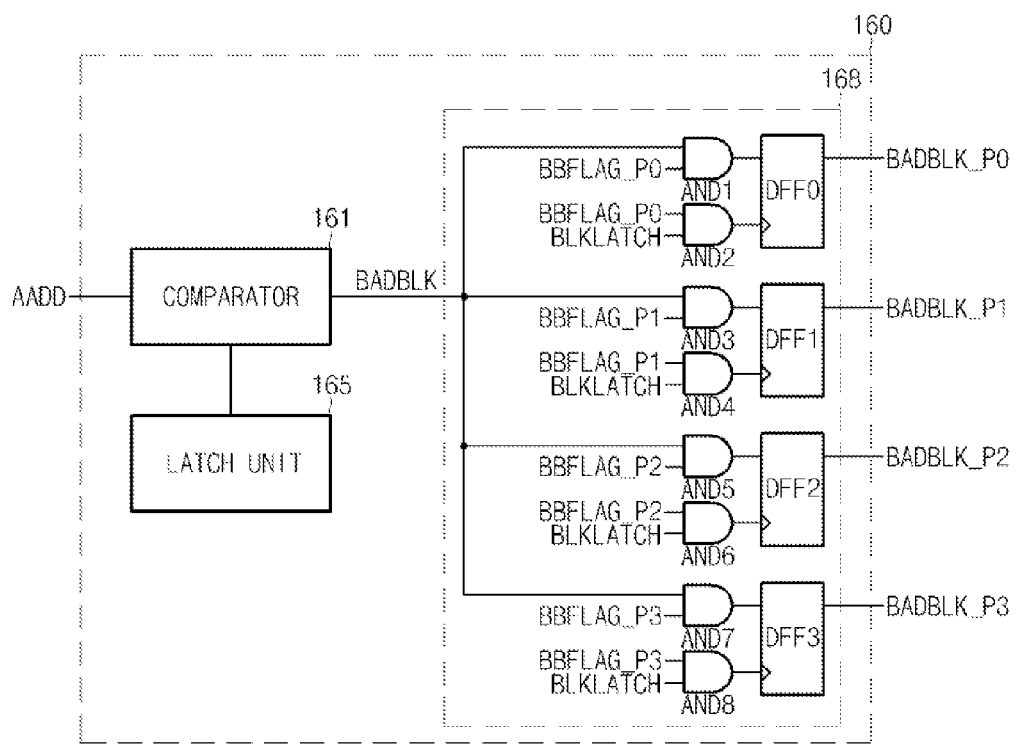
FIG. 2 illustrates a detailed circuit diagram of a bad block detector shown in FIG. 1.

FIG. 2 illustrates a detailed circuit diagram of the bad block detector 160 shown in FIG. 1.

Referring to FIG. 2, the bad block detector 160 includes a comparator 161, a latch unit 165, and a bad block controller 168.

The latch unit 165 stores address information for a bad block. The comparator 161 compares the address information for bad blocks, i.e., bad block addresses, stored in the latch unit 165 with an access address AADD that is input to access a block in the memory cell array 110, so that the comparator 161 outputs a bad-block detection signal BADBLK.

In an embodiment, the access address AADD includes a block address AXBLC for selecting a block and a plane address AXPLANE, i.e., plane address information, for selecting a plane in the memory cell array 110. The plane address AXPLANE is included in the access address AADD as least significant bit (LSB) information.

The bad block controller 168 includes a logical operation unit and a flip-flop unit. The logical operation unit includes a plurality of AND gates AND1~AND8. The flip-flop unit includes a plurality of D flip-flops DFF0~DFF3.

The AND gate AND1 performs a logical AND operation on a bad-block detection signal BADBLK and a bad-block flag signal BBFLAG_P0. The AND gate AND2 performs a logic AND operation on the bad-block flag signal BBFLAG_P0 and a block latch signal BLKLATCH. If an output signal of the AND gate AND2 is enabled or activated, the D flip-flop DFF0 performs flip-flopping on an output signal of the AND gate AND1 to output a bad-block pulse BADBLK_P0.

The AND gate AND3 performs a logic AND operation on the bad-block detection signal BADBLK and a bad-block flag signal BBFLAG_P1. The AND gate AND4 performs a logic AND operation on the bad-block flag signal BBFLAG_P1 and the block latch signal BLKLATCH. If an output signal of the AND gate AND4 is enabled, the D flip-flop DFF1 performs flip-flopping on an output signal of the AND gate AND3 to output a bad-block pulse BADBLK_P1.

The AND gate AND5 performs a logic AND operation on the bad-block detection signal BADBLK and a bad-block flag signal BBFLAG_P2. The AND gate AND6 performs a logic AND operation on the bad-block flag signal BBFLAG_P2 and the block latch signal BLKLATCH. If an output signal of the AND gate AND6 is enabled, the D flip-flop DFF2 performs flip-flopping on an output signal of the AND gate AND5 to output a bad-block pulse BADBLK_P2.

The AND gate AND7 performs a logical AND operation on the bad-block detection signal BADBLK and a bad-block flag signal BBFLAG_P3. The AND gate AND8 performs a logical AND operation on a bad-block flag signal BBFLAG_P3 and the block latch signal BLKLATCH. If an output signal of the AND gate AND8 is enabled, the D flip-flop DFF3 performs flip-flopping on an output signal of the AND gate AND7 to output a bad-block pulse BADBLK_P3.

Figure 3:
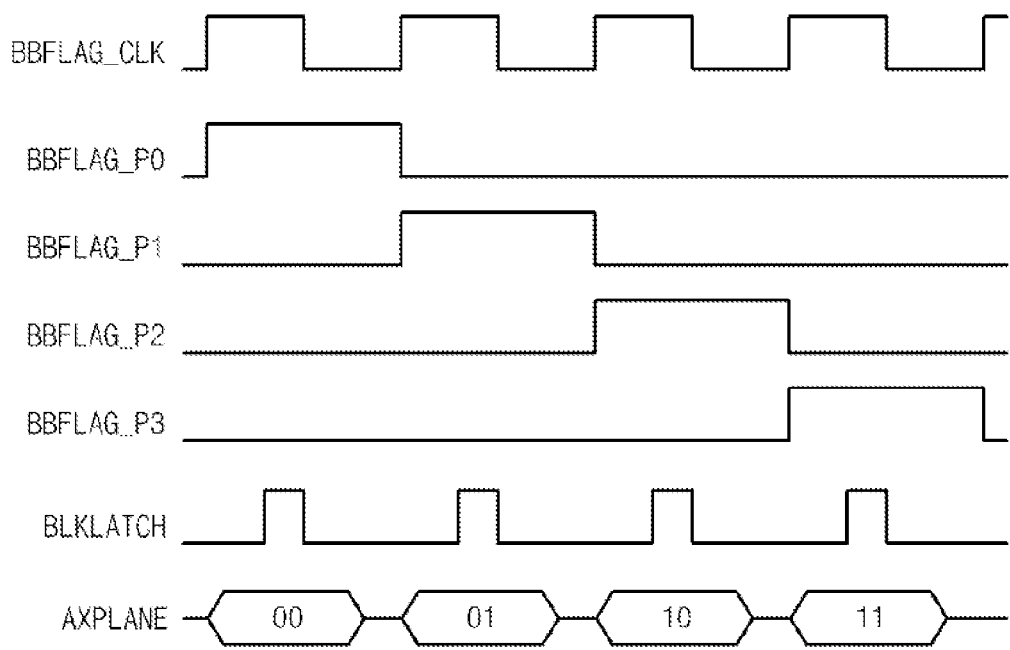
FIG. 3 is a timing diagram illustrating operations of the bad block detector shown in FIG. 2.

FIG. 3 is a timing diagram illustrating operations of the bad block detector 160 shown in FIG. 2. In FIG. 3, it is assumed that there are four planes, e.g., P0~P3, in the memory cell array 110 even though the four planes are not shown.

Referring to FIG. 3, when a power-supply voltage is input to the semiconductor memory device, bad block addresses stored in a memory block are transferred to the latch unit 165.

In an embodiment, bad block information, i.e., the bad block addresses, read out of the memory cell array 110 is stored in the page buffer (PB) group 120 during an initialization operation. After that, the bad block information stored in the page buffer (PB) group 120 may be transferred to the latch unit 165 through the I/O logic 150.

In addition, during the initialization operation, a program command, address information, and data to be programmed are transmitted from an external node to the I/O logic 150. The program command and the address information from the external node may be input to the bad block detector 160 through the I/O logic 150.

If the address information, i.e., access addresses AADD for selecting blocks in respective planes P0~P3, is serially input thereto, the comparators 161 compares the access addresses AADD with the bad block addresses stored in the latch unit 165. If each of the access addresses AADD corresponds to any of the bad block addresses, i.e., an address of a bad block, the comparator 161 outputs a bad-block detection signal BADBLK having, e.g., a high level.

The bad-block detection signal BADBLK indicates whether the bad block address stored in the latch unit 165 is identical to the access address AADD.

If the comparison result, i.e., the bad block detection signal BADBLK, of the comparator 161 is input thereto, the bad block controller 168 sequentially outputs the bad-block pulses BADBLK_P0~BADBLK_P3 corresponding to the bad block detection signal BADBLK in response to the bad-block flag signals BBFLAG_P0~BBFLAG_P3 and the block latch signal BLKLATCH. D flip-flops DFF0~DFF3 are designed to sequentially output the bad-block pulses BADBLK_P0~BADBLK_P3 according to an inputting sequence of the access addresses AADD for the planes P0~P3.

In an embodiment, the D flip-flops DFF0~DFF3 operate only when the block latch signal BLKLATCH is enabled to a logic high level.

If an operation for accessing a bad block is detected according to the bad-block pulses BADBLK_P0~BADBLK_P3, the block selector 141 prevents a memory block, which has been determined as the bad block, from being accessed by a corresponding access address AADD.

In FIG. 3, the bad-block flag signals BBFLAG_P0~BBFLAG_P3 are synchronized with rising edges of a flag clock BBFLAG_CLK so that they can be sequentially enabled. In this embodiment of the present invention, the access addresses AADD are sequentially compared with the bad block addresses for all planes and the comparison results are output to the block selector 140 in response to the bad-block flag signals BBFLAG_P0~BBFLAG_P3 that are sequentially enabled.

That is, the bad-block flag signal BBFLAG_P0 is enabled at a first rising edge of the flag clock BBFLAG_CLK and maintains the enabled state for one cycle of the flag clock BBFLAG_CL. The bad-block flag signal BBFLAG_P1 is enabled at a second rising edge of the flag clock BBFLAG_CLK and maintains the enabled state for one cycle of the flag clock BBFLAG_CL.

The bad-block flag signal BBFLAG_P2 is enabled at a third rising edge of the flag clock BBFLAG_CLK and maintains the enabled state for one cycle of the flag clock BBFLAG_CL, and the bad-block flag signal BBFLAG_P3 is enabled at a fourth rising edge of the flag clock BBFLAG_CLK and maintains the enabled state for one cycle of the flag clock BBFLAG_CL.

In an embodiment, the block latch signal BLKLATCH is generated to be enabled for a predetermined time every cycle of the flag clock BBFLAG_CLK.

In an embodiment, the plane address AXPLANE of the access address AADD may include any of "00", "01", "10", and "11", which select the planes P0~P3, respectively.

For example, if a first access address AADD, which includes the plane address AXPLANE "00" to access a block in the plane P0, is input, the first access address AADD is compared with the bad-block addresses stored in the latch unit 165, and then the bad-block detection signal BADBLK is output to the bad block controller 168 according to the comparison result.

After that, if the block latch signal BLKLATCH transitions from a logic low level to a logic high level, the bad block controller 168 performs flip-flopping on the bad-block detection signal BADBLK when the bad-block flag signal BBFLAG_P0 is enabled to a high level, so that the bad block controller 168 outputs the bad-block pulse BADBLK_P0. Until the bad-block pulse BADBLK_P0 is output after the first access address AADD corresponding to the plane P0 is input, the bad-block flag signals BBFLAG_P1~BBFLAG_P3 maintain disabled states, e.g., a low level, as shown in FIG. 3.

Thereafter, if a second access address AADD, which includes the plane address AXPLANE "01" to access a block in the plane P1, is input, the second access address AADD is compared with the bad-block addresses stored in the latch unit 165, and then the bad-block detection signal BADBLK is output to the bad block controller 168 according to the comparison result.

After that, if the block latch signal BLKLATCH transitions from a logic low level to a logic high level, the bad block controller 168 performs flip-flopping on the bad-block detection signal BADBLK when the bad-block flag signal BBFLAG_P1 is enabled to a high level, so that the bad block controller 168 outputs the bad-block pulse BADBLK_P1. Until the bad-block pulse BADBLK_P1 is output after the second access address AADD corresponding to the plane P1 is input, the bad-block flag signals BBFLAG_P0 and BBFLAG_P2~P3 maintain disabled states, e.g., a low level, as shown in FIG. 3.

Subsequently, if a third access address AADD, which includes the plane address AXPLANE "10" to access a block in the plane P2, is input, the third access address AADD is compared with the bad-block addresses stored in the latch unit 165, and then the bad-block detection signal BADBLK is output to the bad block controller 168 according to the comparison result.

After that, if the block latch signal BLKLATCH transitions from a logic low level to a logic high level, the bad block controller 168 performs flip-flopping on the bad-block detection signal BADBLK when the bad-block flag signal BBFLAG_P2 is enabled to a high level, so that the bad block controller 168 outputs the bad-block pulse BADBLK_P2. Until the bad-block pulse BADBLK_P2 is output after the third access address AADD corresponding to the plane P2 is input, the bad-block flag signals BBFLAG_P0~P1 and BBFLAG_3 maintain disabled states, e.g., a low level, as shown in FIG. 3.

Finally, if a fourth access address AADD, which includes the plane address AXPLANE "11" to access a block in the plane P3, is input, the fourth access address AADD is compared with the bad-block addresses stored in the latch unit 165, and the bad-block detection signal BADBLK is output to the bad block controller 168 according to the comparison result.

After that, if the block latch signal BLKLATCH transitions from a logic low level to a logic high level, the bad block controller 168 performs flip-flopping on the bad-block detection signal BADBLK when the bad-block flag signal BBFLAG_P3 is enabled to a high level, so that the bad block controller 168 outputs the bad-block pulse BADBLK_P3. Until the bad-block pulse BADBLK_P3 is output after the fourth access address AADD corresponding to the plane P3 is input, the bad-block flag signals BBFLAG_P0~P2 maintain disabled states, e.g., a low level, as shown in FIG. 3.

In conclusion, in the related art, one comparator is used for each plane so as to compare an input access address with a bad block address, and the comparison operation is performed in parallel in planes of the memory cell array 110. On the other hand, in accordance with the embodiments of the present invention, the single comparator 161 is used to compare input access addresses for more than two planes in the memory cell array 110, which are serially input, with bad block addresses stored in the latch unit 165, so that a plurality of bad-block pulses, e.g., BADBLK_P0~BADBLK_P3, is sequentially output according to inputting sequence of the access addresses AADD.

Figure 4:
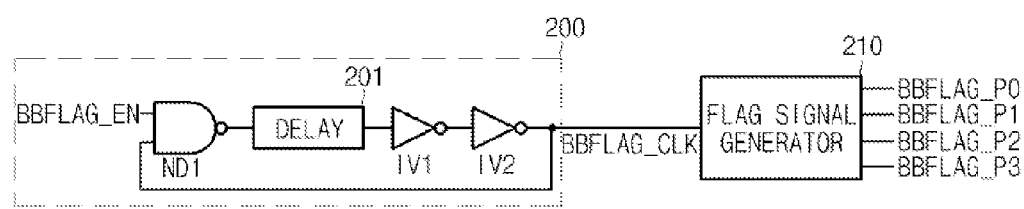
FIG. 4 illustrates a circuit diagram of a clock generator and a flag signal generator.

FIG. 4 illustrates a circuit diagram of a clock generator 200 and a flag signal generator 210. The clock generator 200 generates the flag clock BBFLAG_CLK shown in FIG. 3. The flag signal generator 210 generates the bad-block flag signals BBFLAG_P0~BBFLAG_P3.

In an embodiment, the clock generator 200 may include a ring oscillator. For example, the clock generator 200 includes a NAND gate ND1, a delay unit 210, and a plurality of inverters IV1 and IV2.

Referring to FIG. 4, the NAND gate ND1 performs a NAND operation on a flag enable signal BBFLAG_EN and the flag clock BBFLAG_CLK feedback from an output node of the clock generator 200. The delay unit 201 delays an output signal of the NAND gate ND1 for a predetermined time, and outputs the delayed result. In addition, the inverters IV1 and IV2 twice invert an output signal of the delay unit 201, thereby generating the flag clock BBFLAG_CLK.

The flag signal generator 210 sequentially enables the bad-block flag signals BBFLAG_P0~BBFLAG_P3 at intervals of one cycle of the flag clock BBFLAG_CLK. That is, the flag signal generator 210 sequentially enables the bad-block flag signals BBFLAG_P0~BBFLAG_P3 at each rising edge of the flag clock BBFLAG_CLK, and outputs the sequentially enabled bad-block flag signals BBFLAG_P0~BBFLAG_P3 as shown in FIG. 3.

As is apparent from the above description, the embodiment of the present invention provides a technology for comparing serially input access addresses, for at least two planes in a memory cell array including a plurality of planes, with bad block addresses using one comparator circuit irrespective of the number of planes, to determine whether the input access address corresponds to a bad block. Through the use of the single comparator circuit for at least two planes, it is possible to reduce the size of a chip.

Those skilled in the art will appreciate that embodiments may be carried out in other specific ways than those set forth herein without departing from the spirit and essential characteristics. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, claims that are not explicitly cited in each other in the appended claims may be presented in combination as an exemplary embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor memory device comprising:
   a memory cell array including a plurality of planes, each plane including a plurality of blocks;
   a bad block detector configured to determine whether each of input addresses for accessing corresponding blocks of the plurality of planes corresponds to any of bad block addresses and sequentially output a plurality of bad-block pulses showing the determination results according to an input sequence of the input addresses, a bad block address being an address for accessing a block determined as a bad block; and
   a block selector configured to receive the plurality of bad-block pulses and select the corresponding blocks of the plurality of planes in response to the plurality of bad-block pulses, respectively,
   wherein the bad block detector comprises:
   a latch unit configured to store the bad block addresses;
   a comparator configured to compare the bad block addresses with each of the input addresses to output a bad-block detection signal; and
   a bad block controller configured to sequentially output the plurality of bad-block pulses corresponding to the bad-block detection signal in response to a plurality of bad-block flag signals that are sequentially activated according to the input sequence of the input addresses,
   wherein the plurality of bad-block flag signals corresponds to the plurality of planes, respectively.

2. The semiconductor memory device according to claim 1, wherein an input address includes a block address for selecting a block and a plane address for selecting one of the plurality of planes.

3. The semiconductor memory device according to claim 1, wherein the bad block controller outputs a corresponding one of the plurality of bad block pulses if a block latch signal is enabled while a corresponding one of the bad-block flag signals is enabled.

4. The semiconductor memory device according to claim 3, wherein the bad block controller includes:
   a logic operation unit configured to perform a logic operation on the plurality of bad-block flag signals, and the block latch signal, and output logic output signals; and
   a flip-flop unit configured to perform flip-flopping on the bad-block detection signal in response to the logic output signals to output the plurality of bad block pulses.

5. The semiconductor memory device according to claim 4, wherein the logic operation unit includes:
   a first logic unit configured to provide the bad-block detection signal to the flip-flop unit in response to a corresponding one of the bad-block flag signals that is enabled; and
   a second logic unit configured to perform a logic operation on the block latch signal and the corresponding one of the bad-block flag signals, and output a corresponding one of the logic output signals.

6. The semiconductor memory device according to claim 4, wherein the flip-flop unit includes a plurality of D flip-flops.

7. The semiconductor memory device according to claim 1, wherein the plurality of bad-block flag signals is sequentially enabled at intervals of one cycle of a flag clock.

8. The semiconductor memory device according to claim 1, further comprising:
   a flag signal generator configured to sequentially enable and output the plurality of bad-block flag signals at each rising edge of a flag clock.

9. The semiconductor memory device according to claim 8, further comprising:
   a clock generator configured to generate the flag clock.

10. The semiconductor memory device according to claim 9, wherein the clock generator includes a ring oscillator.

11. The semiconductor memory device according to claim 1, wherein the plurality of planes includes at least two planes in the semiconductor memory device.

12. A method for controlling a semiconductor memory device, which includes a memory cell array having a plurality of planes, the method comprising:
   sequentially receiving input addresses for accessing corresponding blocks of the plurality planes, each plane including a plurality of blocks;
   comparing each of the input addresses with bad block addresses each of which is an address for accessing a block determined as a bad block;
   sequentially outputting a plurality of bad-block pulses showing the comparison results according to an input sequence of the input addresses, wherein the plurality of bad-block pulses corresponds to the plurality of planes, respectively; and
   accessing blocks of the plurality of planes in response to the plurality of bad-block pulses, respectively,
   wherein the plurality of bad-block pulses is sequentially output in response to a block latch signal and respective bad-block flag signals.

13. The method according to claim 12, wherein an input address includes a block address for selecting a block and a plane address for selecting one of the plurality of planes.

14. The method according to claim 12, wherein each of the plurality of bad-block flag signals is enabled at a rising edge of a flag clock and maintains an enabled state for one cycle of the flag clock, according to the input sequence of the input addresses.

15. The method according to claim 12, wherein the block latch signal is enabled for a predetermined time while each of the plurality of bad-block flag signals is enabled.

16. The method according to claim 12, wherein the plurality of planes includes at least two planes in the semiconductor memory device.

17. A semiconductor memory device comprising:
   a memory cell array in which a read or write operation of data is achieved;
   a bad block detector configured to compare an access address with a bad block address, and sequentially output a plurality of bad block pulses including bad block information; and
   a block selector configured to select a block of the memory cell array, and disable a bad block detected from the bad block detector,
   wherein the bad block detector includes:
   a latch unit for storing the bad block address;
   a comparator configured to output a bad-block detection signal by comparing the bad block address with the access address; and
   a bad block controller configured to sequentially output the plurality of bad block pulses corresponding to the bad-block detection signal in response to a plurality of bad-block flag signals that are sequentially activated.

* * * * *